United States Patent [19]
Ma

[11] Patent Number: 5,880,520
[45] Date of Patent: Mar. 9, 1999

[54] LOW MUTUAL INDUCTANCE LEAD FRAME DEVICE

[75] Inventor: Manny Ma, Boise, Id.

[73] Assignee: Micron Technology, Inc., Boise, Id.

[21] Appl. No.: 52,240

[22] Filed: Mar. 31, 1998

[51] Int. Cl.$^6$ .................................................. H01L 23/552
[52] U.S. Cl. .......................................... 257/659; 257/666
[58] Field of Search ...................................... 257/659, 666

[56] References Cited

U.S. PATENT DOCUMENTS

| | | |
|---|---|---|
| 5,359,222 | 10/1994 | Okumotomo et al. . |
| 5,485,037 | 1/1996 | Marrs . |
| 5,659,198 | 8/1997 | Okutomo et al. . |
| 5,679,975 | 10/1997 | Wyland et al. . |

*Primary Examiner*—Mahshid D. Saadat
*Assistant Examiner*—S. V. Clark

*Attorney, Agent, or Firm*—Fletcher, Yoder & Van Someren

[57] ABSTRACT

A packaged semiconductor device, such as a lead frame device, includes a circuit supported within an enclosure. The circuit is coupled to a plurality of conductive leads within the enclosure. The leads extend from the enclosure for electrically coupling the circuit to external circuitry. At least one of the leads is shielded to reduce inductive coupling and crosstalk between the leads during high frequency switching. The shielded lead has a conductive base, a non-conductive layer disposed on the base, and a conductive layer disposed on the non-conductive layer. The non-conductive and conductive layers may be formed prior to electrically coupling the lead to the circuit, or following assembly of the lead frame package. The shielding may extend into the package enclosure, or may terminate external to the enclosure.

30 Claims, 3 Drawing Sheets

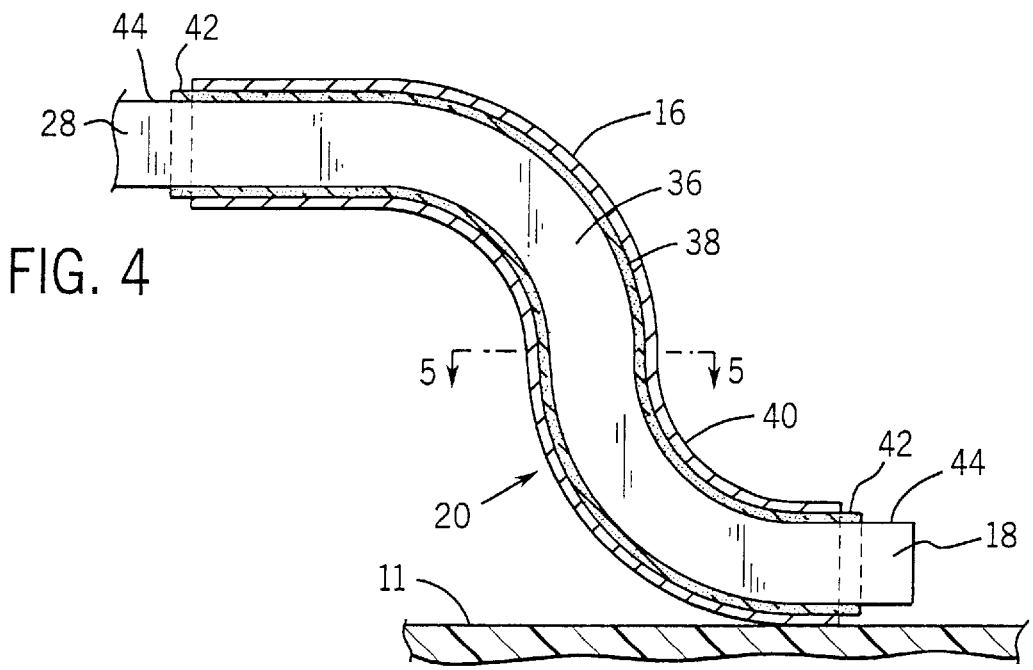
FIG. 4
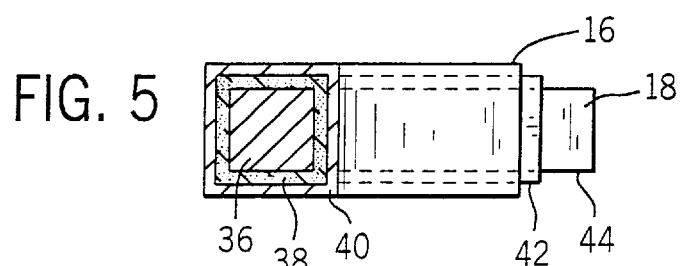
FIG. 5
FIG. 6
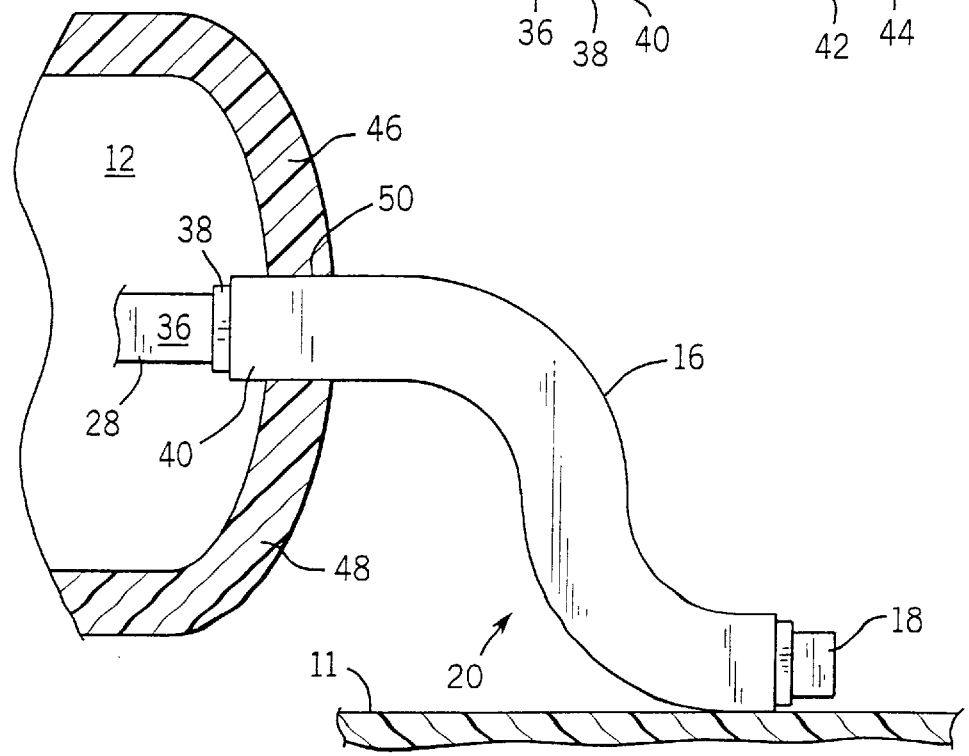

LOW MUTUAL INDUCTANCE LEAD FRAME DEVICE

BACKGROUND OF THE INVENTION

1. Field of the Invention

The present invention relates generally to the field of semiconductor devices housed in lead frame packages designed to be coupled to external circuitry. More particularly, the invention relates to a lead frame device in which leads are shielded from one another to reduce inductive coupling between the leads during operation of the circuitry housed within the lead frame package.

2. Description of the Related Art

A variety of applications exist for preconfigured electronic circuitry which can be integrated into larger electronic systems in a straightforward and rapid manner. Such pre-configured circuitry is commonly formed in multi-layer semiconductor devices. The devices may include memory circuits, signal processing circuits, analog-to-digital conversion circuits, and so forth. Power electronic circuitry may be manufactured in a similar manner, including such devices as power MOSFETs, insulated-gate, bi-polar transistors (IGBTs), and so forth. To facilitate handling and installation, the electronic circuitry is conveniently supported in an enclosure, often referred to as a "lead frame package." Conductive leads are electrically coupled to the circuitry within the package, and extend from the package for interfacing the circuitry with external components during installation.

Current lead frame-packaged devices often include from 3 to 50 or more leads extending from the circuit enclosure. Depending upon the circuit design, various signals are transmitted via the leads between the lead frame circuit and external circuitry with which the lead frame is interfaced. In an increasing number of applications, miniaturization of the electronic circuitry and the lead frame package has permitted a significant reduction in the size of the leads extending from the packages, and of the spacing between the leads. For example, lead spacings of less than one millimeter, and sometimes less than one half of one millimeter are not uncommon.

In addition to an increase in the number of leads utilized in lead frame packages, and the reduction in the lead size and spacing, switching rates for the circuitry housed within lead frame packages has increased substantially over recent years. For example, it is not uncommon to find switching frequencies of several hundred megahertz in currently available devices. At such high switching rates, signals transmitted through adjacent conductors extending from the lead frame device may cause interference with one another. In particular, because inductive coupling or crosstalk between the leads is typically a function of the rate of change of currents through the leads, such high switching rates may result in sufficient signal interference to cause bit errors in logic signals, or to otherwise degrade performance of the circuitry.

There is a need, therefore, for improved lead frame devices which reduce the risk of inductive interference between the leads extending from the devices. In particular, there is a need for a technique for limiting crosstalk between leads in a lead frame package, which permits spacing between the leads to be reduced, while at the same time allowing very high switching or cycle rates for signals transmitted via the leads.

SUMMARY OF THE INVENTION

The present invention provides an improved lead frame device designed to respond to these needs. The technique of the invention permits leads extending from the lead frame package to be electrically or electromagnetically shielded from one another to reduce or eliminate inductive coupling, and therewith, crosstalk between the leads. The technique is based upon shielding of designated leads extending from the package. Where appropriate, all leads extending from the package may be similarly shielded. The shielding typically includes a non-conductive layer or coating disposed over a portion of the shielded lead. A conductive shielding coating is then formed over the non-conductive layer to provide the desired shielding effect. The non-conductive and conductive layers may extend into the lead frame package, or may terminate at locations outside the package. Moreover, the layers may be disposed on conductive bases of the leads either prior to assembly of the lead frame package, during assembly of the package, or subsequent to assembly. The shielding technique may be used on lead frame packages of existing design, or may be employed to permit further reductions in the package size, alternative dispositions of leads extending from the packages, and higher switching rates for elements of the circuitry disposed within the package. Also, where desired, the shielding may extend completely around the shielded lead, or may be disposed on designated side portions of the lead, such as on faces directed toward adjacent leads.

Thus, in accordance with a first aspect of the invention, a packaged semiconductor device includes a semiconductor circuit, an enclosure, and a plurality of leads. The circuit is formed on a circuit support. The enclosure at least partially surrounds the support. The leads are electrically coupled to the circuit and extend from the enclosure. At least one of the leads is a shielded lead. The shielded lead has a conductive base, a non-conductive layer disposed on and extending along at least a portion of the base, and a conductive layer disposed on and extending along at least a portion of the non-conductive layer. The non-conductive layer may extend beyond the conductive layer at one or both ends thereof. Moreover, the conductive base may extend beyond the non-conductive layer to facilitate electrical coupling of the lead to the circuit within the enclosure, and to external circuitry.

In accordance with another aspect of the invention, a lead frame device is provided that includes a housing, an electronic circuit, and a plurality of shielded leads. The electronic circuit is supported within the housing. The leads are electrically coupled to the circuit and extend from the housing. Each lead includes a conductive base, a non-conductive layer disposed over a portion of the base, and a conductive layer disposed over a portion of the non-conductive layer. Additional, non-shielded leads may also be coupled to the circuitry within the housing, and extend from the housing adjacent to or spaced from the shielded leads.

The invention also provides a method for making a lead frame device. In accordance with one aspect of the method, a circuit is supported within an enclosure, and at least one elongated conductive lead base is provided. A non-conductive layer is formed over at least a portion of the conductive lead base. A conductive shielding layer is formed over at least a portion of the non-conductive layer. The conductive lead base is electrically coupled to the circuit within the enclosure.

The non-conductive and conductive layers may be formed by various processes and at various thicknesses, depending upon the anticipated signals to be transmitted through the leads. For example, the non-conductive layer may be formed of polyimide, and the conductive layer, formed of a conductive metal, such as copper or aluminum, may be disposed on the non-conductive layer by sputtering. Moreover, the non-conductive layer may be masked to expose regions of that layer in the final product. Moreover, the non-conductive and conductive layers may be formed prior to electrically coupling the conductive lead base to the circuit, or following assembly of the lead base with the circuit.

BRIEF DESCRIPTION OF THE DRAWINGS

The foregoing and other advantages and features of the invention will become apparent upon reading the following detailed description and upon reference to the drawings in which:

FIG. 4 is a partial sectional view of a shielded lead for reducing mutual inductance between leads extending from a lead frame device of the type shown in FIG. 1;

FIG. 5 is a sectional view of the lead illustrated in FIG. 4 taken along line 5—5, illustrating layers of conductive and non-conductive materials on the lead base;

FIG. 6 is a side view of a shielded lead shown extending into the enclosure of a lead frame package;

DETAILED DESCRIPTION OF SPECIFIC EMBODIMENTS

Figure 1:
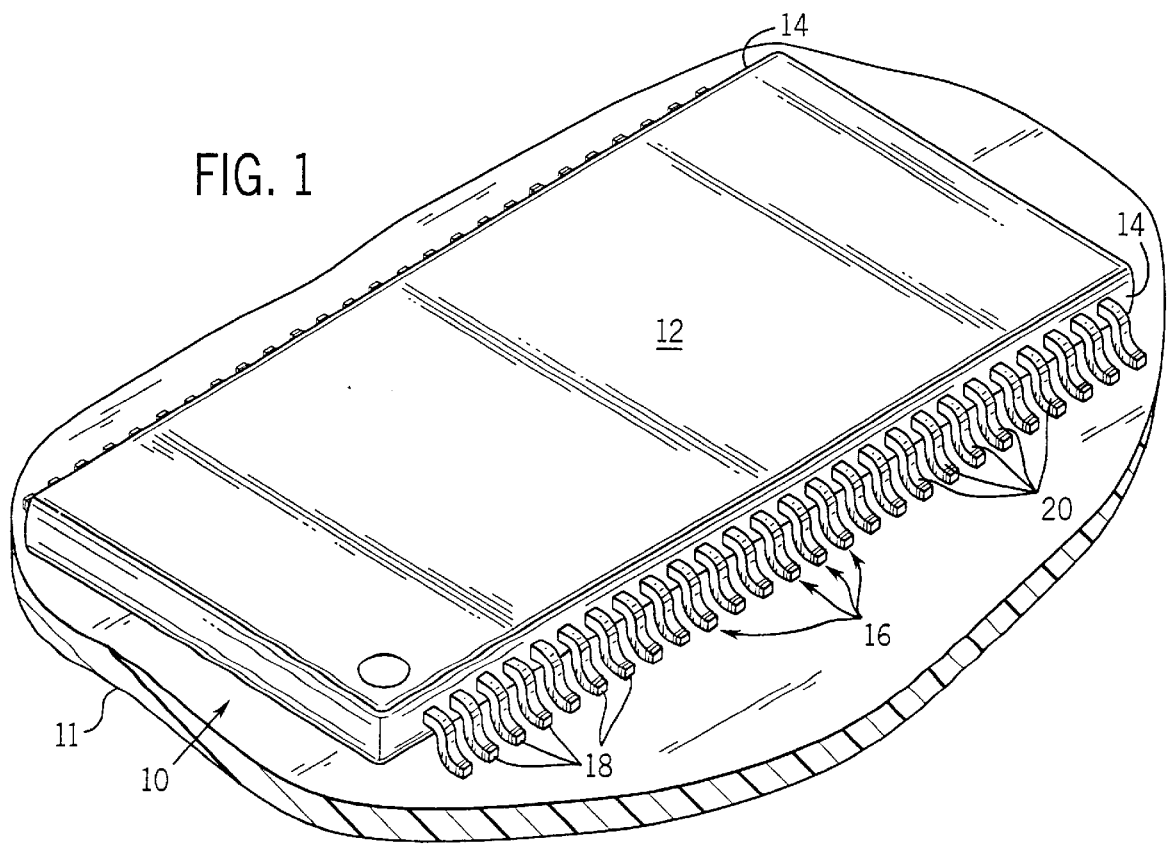
FIG. 1 is a perspective view of a lead frame device in the form of a dynamic random access memory adapted for low mutual inductance between leads extending from the device package.

Turning now to the drawings, and referring first to FIG. 1, a lead frame device 10 is illustrated in the form of a dynamic random access memory (DRAM) for storing digitized data, electrically coupled to a printed circuit board or mother board 11. It should be understood that other types of circuits, such as microprocessors for instance, may also benefit from the present technique. Circuitry defining the operation of lead frame device 10 is housed within an enclosure 12 which is typically constructed of a durable, non-conductive plastic material. Device 10 has a series of sides or edges 14 from which leads 16 extend. Leads 16 are electrically coupled to circuitry formed on or disposed on printed circuit board 11. In the illustrated embodiment lead frame device 10 has 26 leads extending from diametrically opposed sides. However, it should be understood that the number and positions of the leads may vary depending upon the circuitry housed within lead frame device 10 and the number of inputs and outputs required for proper operation of the circuitry. Moreover, as will appreciated by those skilled in the art, lead frame device 10 may include more or fewer leads depending upon its internal circuitry and operation. For example, device 10 may include as few as two or three leads extending from enclosure 12, such as for operation of a single solid state switching device (e.g., a MOSFET, or an IGBT). It should also be noted that leads 16 may extend from one or more faces or side panels of device 10, and may be arranged in one or more lines, or in a grid or matrix array.

Each lead 16 extending from lead frame device 10 includes a conductive region, such as at the tip of each lead as illustrated in FIG. 1. The conductive regions of the leads 16 permit the electronic circuitry housed within enclosure 12 to be interfaced or electrically coupled to external circuitry during installation and use, as will be appreciated by those skilled in the art. It has been found that in conventional lead frame devices similar to that illustrated in FIG. 1, but including unshielded leads, inductance of the conductive lead material can cause inductive coupling or crosstalk between the leads, particularly during high speed switching operations of the internal or external circuitry. To reduce or limit the potential for such inductive coupling, leads 16 include a shielded region, as indicated generally by the reference numeral 20. As described more fully below, shielded regions 20 include a layer of non-conductive material disposed over the conductive base material of the lead, and a layer of conductive material disposed over the non-conductive material.

Figure 2:
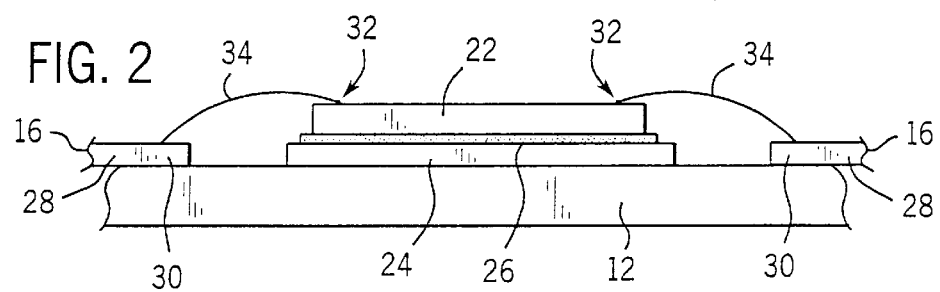
FIG. 2 is an elevational side view of a portion of a semiconductor circuit within a device of the type illustrated in FIG. 1, showing a first manner for electrically coupling leads extending from the device to the semiconductor circuitry.
Figure 3:
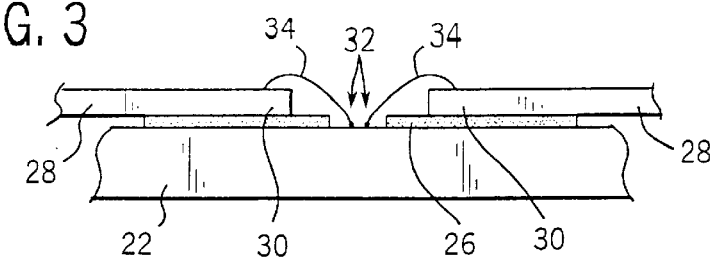
FIG. 3 is an elevational view of a portion of a semiconductor device in a lead frame package showing an alternative arrangement for coupling the circuitry to the leads.

As mentioned above, lead frame device 10 may include a variety of internal circuits which are coupled to external circuitry via leads 16. In general, such internal circuitry will be formed in or supported on a circuit board or semiconductor die as illustrated in FIGS. 2 and 3. The circuitry supported on the die, indicated by reference numeral 22 in FIGS. 2 and 3, will be electrically coupled to specific leads 16 at specific locations as defined by the configuration and layout of the circuitry on the die. In the configuration shown in FIG. 2, the semiconductor die 22 is mounted on a support or paddle 24 and firmly secured to the support by an adhesive layer 26. Lead fingers 28 of lead 16 extend into positions adjacent to support 24 and terminate in conductive inner ends 30. Adjacent to conductive ends 30, semiconductor die 22 includes conductive regions or contact pads 32 designed to conduct signals between the circuitry supported on die 22 and external circuitry via leads 16. During assembly of lead frame device 10, conductive ends 30 of the leads are secured to contact pads 32 by various means, such as bonded wire segments 34.

An alternative arrangement for electrically coupling leads 16 to internal circuitry is shown in FIG. 3. In the embodiment of FIG. 3, which may be referred to as a lead-over-chip or lead-on-chip (LOC) design, lead fingers 28 of each lead are extended to a region above die 22. The lead fingers are secured in position above die 22 by an adhesive layer or tape 26. Contact pads 32 for conducting signals to and from the circuitry supported on die 22 are electrically coupled to conductive ends 30 of each lead via bond wire 34. As will be appreciated by those skilled in the art, lead fingers 28 may be secured by other arrangements within the lead frame package, and may be electrically coupled to circuitry within the package by alternative techniques.

From their connection with the circuitry supported within enclosure 12, leads 16 extend from enclosure 12 for coupling to external circuitry (not shown). At least a portion of the leads are shielded to limit crosstalk between the leads, as best illustrated in FIGS. 4 and 5. In particular, each lead includes a conductive base 36 for conducting signals to and from the circuitry supported within the lead frame device. Conductive base 36 may be made of any suitable conductive material, such as copper or iron-nickel alloy. A non-conductive or dielectric layer 38 is disposed over conductive base 36. Non-conductive layer 38 may comprise of any suitable material, such as polyimide, a dielectric material (e.g., SiO$_2$), or an insulative material (e.g., boron-phosphorus-silicate glass). A conductive shielding layer 40 is disposed over non-conductive layer 38 to provide shielding from inductive coupling between the leads. Shielding layer 40 may be made of any suitable conductive material, such as copper or aluminum.

Non-conductive layer 38 and shielding layer 40 are disposed over a predetermined length of each shielded lead 16, leaving conductive region 18 and lead finger 28 exposed for electrically coupling the lead to circuitry both within and external to the lead frame package. While non-conductive layer 38 and shielding layer 40 may terminate at approximately the same location along conductive base 36, in the illustrated embodiment, non-conductive layer 38 extends slightly beyond shielding layer 40 to avoid electrical contact between conductive base 36 and shielding layer 40. Non-conductive layer 36 thus terminates to provide an exposed tip 44 on either end of conductive base 36, thereby defining conductive region 18 and lead finger 28.

As will be appreciated by those skilled in the art, the thickness and disposition of conductive base 36, non-conductive layer 38 and shielding layer 40 may vary depending upon the types, waveforms, amplitudes and frequencies of signals being conducted via the leads. By way of example, conductive base 36 may be 0.2 mm thick, and non-conductive layer 38 and shielding layer 40 may be disposed on non-conductive layer 38 to a combined thickness of approximately 10–20 microns. Moreover, in the configuration illustrated in FIGS. 4 and 5, conductive base 36 may extend beyond non-conductive layer 38 by approximately 4–5 mils in the region of lead finger 28, or a sufficient amount to permit bonding to the lead frame circuit die. Conductive region 18 extends beyond non-conductive layer 38 a sufficient length to permit conventional PCB or TAB bonding to an external circuit board or the like (not shown). These structures permit a range of lead pitch dimensions, depending upon the frequencies of signals to be carried. In particular, a 0.65 mm center-to-center pitch may be used.

While the materials and dimensions described above are suitable for certain types of applications, it should be noted that conductive base 36 may be formed in alternative shapes, such as in configurations having flat, rectangular cross-sections, circular cross-sections, and so forth. Moreover, the particular shape of leads 16 extending from enclosure 12 may be other than the generally S-shaped structure illustrated in FIG. 4. Specifically, depending upon the type of device and connection necessary for specific applications, leads 16 may be straight, or may be configured in C- or J-shapes (see, e.g. FIG. 7).

Figure 7:
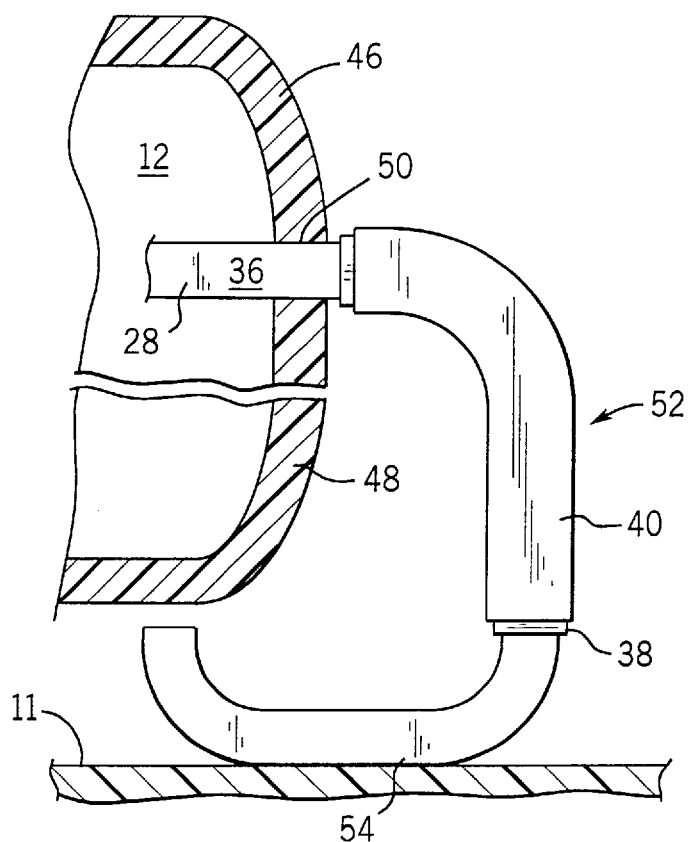
FIG. 7 is a side view of an alternatively configured lead shown extending into the enclosure of a lead frame package.

The shielding provided by non-conductive and conductive layers 38 and 40 on leads 16 may be formed prior to assembly of the leads within lead frame device 10, or subsequent to assembly of the lead frame package. Consequently, as shown in FIGS. 6 and 7, shielding on the leads may extend into the device enclosure, or may terminate outside the device enclosure. As shown in FIG. 6, leads assembled in enclosure 12 may include a non-conductive layer 38 and a shielding layer 40 which extend through a side wall of enclosure 12. In a typical application, the leads will be preformed with non-conductive layer 38 and shielding layer 40, and will be secured between upper and lower halves 46 and 48 of enclosure 12, between which a lead aperture 50 is formed. Housing 12 may thus contact shielding layer 40 to hold leads 16 firmly in alignment.

FIG. 7 illustrates an alternative configuration in which non-conductive layer 38 and shielding layer 40 terminate outside of enclosure 12. Specifically, where desired, upper and lower portions 46 and 48 of enclosure 12 may be secured about conductive base 36 of each lead. Also as illustrated in FIG. 7, depending upon the shape and desired mounting configuration for the leads extending from enclosure 12, non-conductive layer 38 and shielding layer 40 may terminate at various points along conductive base 36. In particular, for the J-shaped lead 52 illustrated in FIG. 7, an elongated exposed region 54 is left at the base of the lead, permitting the lead to be easily soldered to external circuitry upon installation.

As mentioned above, non-conductive layer 38 and shielding layer 40 may be disposed on conductive base 36 of leads 16 either prior to or subsequent to installation of the leads within device 10. For example, prior to installation of the leads within the lead frame package, a dielectric layer may be formed on the leads by vapor deposition or sputtering. Portions of the leads may be masked with photoresist which is subsequently removed to expose regions 18 and lead fingers 28. Alternatively, these regions may be etched subsequent to formation of the dielectric layer. After formation of the dielectric or non-conductive layer, the shielding layer may be formed on the non-conductive layer by sputtering. Where appropriate, additional layers may be formed over conductive base 36, such as between non-conductive layer 38 and conductive layer 40. For example, where polyimide is employed to form non-conductive layer 38, and copper or aluminum is used to form conductive layer 40, a thin barrier layer of metal, such as titanium, may be disposed over the non-conductive layer to prevent clustering of the material forming the conductive layer.

Figure 8:
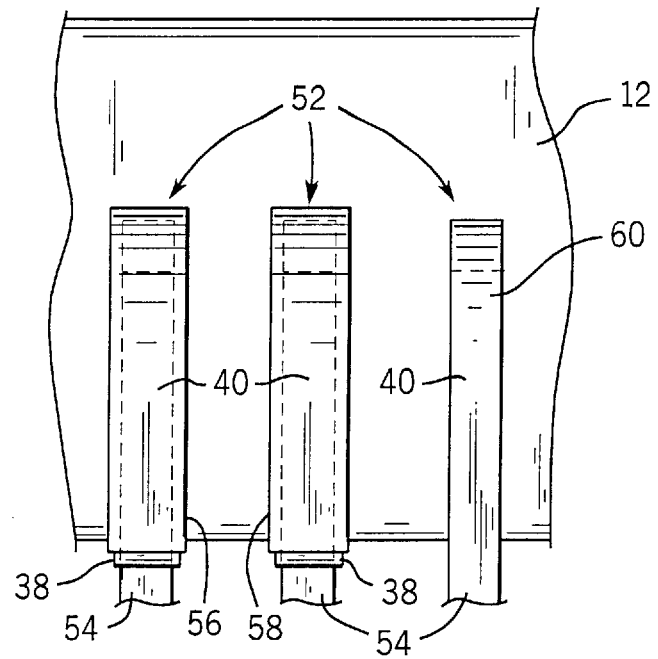
FIG. 8 is an elevational view of a series of leads, both shielded and unshielded, extending from a lead frame package.

In the embodiments described above, non-conductive layer 38 and shielding layer 40 are formed on all peripheral sides of the conductive base 36 of each lead, and terminate at locations along the leads to leave exposed tips or end regions. It should be noted, however, that in appropriate applications, non-conductive layer 38 and shielding layer 40 may be formed on specific side locations of the leads, such as on lateral faces lying adjacent to another lead, leaving other side locations unshielded. Alternatively, lead frame device 10 may include both shielded and unshielded leads, depending upon the anticipated inductive coupling between the specific leads. For example, as illustrated in FIG. 8, a series of J-shaped leads extending from a lead frame enclosure 12 may include a pair of shielded leads 56 and 58, adjacent to an unshielded lead 60. In the specific embodiment of FIG. 8, leads 56 and 58 may be shielded due to high switching rates of circuitry coupled to these leads. The shielding on the leads thus permits crosstalk due to inductive coupling between the leads to be effectively reduced. Where such crosstalk is not anticipated on other leads, such as lead 60, shielding may be reduced or eliminated all together.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A packaged semiconductor device comprising:

a semiconductor circuit disposed on a circuit support;

an enclosure at least partially surrounding the support; and a plurality of leads electrically coupled to the circuit and extending from the enclosure, at least one of the leads comprising a shielded lead, the shielded lead having a conductive base, a non-conductive layer disposed on and extending along at least a portion of the base, and a conductive layer disposed on and extending along at least a portion of the non-conductive layer.

2. The packaged semiconductor device of claim 1, wherein the conductive base of the shielded lead has a first length, and the non-conductive layer has a second length less than the first length, whereby the conductive base extends beyond the non-conductive layer adjacent to at least one end thereof.

3. The packaged semiconductor device of claim 2, wherein the conductive layer has a third length less than the second length, whereby the non-conductive layer extends beyond the conductive layer adjacent to at least one end thereof.

4. The packaged semiconductor device of claim 1, wherein at least two adjacent leads extending from the enclosure are shielded leads.

5. The packaged semiconductor device of claim 1, wherein a first end of the conductive base of the shielded lead is disposed within the enclosure, and wherein the non-conductive layer extends through a side of the enclosure to a location adjacent to the first end.

6. The packaged semiconductor device of claim 5, wherein the conductive layer extends through the side of the enclosure.

7. The packaged semiconductor device of claim 1, wherein the conductive base of the shielded lead extends beyond the non-conductive layer at an end of the shielded lead distal from the circuit.

8. The packaged semiconductor device of claim 7, wherein the non-conductive layer extends beyond the conductive layer at an end of the non-conductive layer distal from the circuit.

9. The packaged semiconductor device of claim 1, wherein the shielded lead includes a lateral face disposed in mutually facing relation with an adjacent lead, and wherein the non-conductive layer and the conductive layer are disposed at least on the lateral face.

10. The packaged semiconductor device of claim 1, wherein the non-conductive layer and the conductive layer have a thickness of from 10 to 20 microns.

11. The packaged semiconductor device of claim 1, wherein the shielded lead further includes a barrier layer disposed intermediate the non-conductive layer and the conductive layer.

12. A lead frame device comprising:
a housing;
an electronic circuit supported within the housing; and
a plurality of shielded leads electrically coupled to the circuit and extending from the housing, each lead includes a conductive base, a non-conductive layer disposed over a portion of the base, and a conductive layer disposed over a portion of the non-conductive layer.

13. The lead frame device of claim 12, wherein the conductive base of each shielded lead includes first and second end regions extending beyond the non-conductive layer, the shielded leads being coupled to the circuit at the first end regions and being configured for coupling to external circuitry at the second end regions.

14. The lead frame device of claim 13, wherein the non-conductive layer of each shielded lead includes first and second exposed regions extending beyond the conductive layer at locations proximate to and distal from the circuit.

15. The lead frame device of claim 12, further comprising at least one non-shielded lead coupled to the electronic circuit and extending from the housing.

16. The lead frame device of claim 12, wherein the non-conductive layer of each shielded lead extends through a side of the housing to a location adjacent to the circuit.

17. The lead frame device of claim 16, wherein the conductive layer of each shielded lead extends through the side of the housing.

18. The lead frame device of claim 12, wherein each shielded lead includes a lateral face disposed in mutually facing relation with an adjacent lead, and wherein the non-conductive layer and the conductive layer of each shielded lead are disposed at least on the lateral face thereof.

19. The lead frame device of claim 12, wherein each shielded lead further includes a barrier layer disposed intermediate the non-conductive layer and the conductive layer thereof.

20. A semiconductor device package for holding and electrically coupling a semiconductor circuit to external circuitry, the package comprising:
an enclosure configured to receive and support the semiconductor circuit; and
a plurality of leads configured to be electrically coupled to the semiconductor circuit and extending from the enclosure, at least one of the leads comprising a shielded lead, the shielded lead having a conductive base, a non-conductive layer disposed on and extending at least a portion of the base, and a conductive layer disposed on and extending along at least a portion of the non-conductive layer.

21. The semiconductor device package of claim 20, wherein the conductive base of the shielded lead has a first length, and a non-conductive layer has a second length less than the first length, whereby the conductive base extends beyond the non-conductive layer adjacent to at least one end of thereof.

22. The semiconductor device package of claim 21, wherein the conductive layer has a third length less than the second length, whereby the non-conductive layer extends beyond the conductive adjacent to at least one end thereof.

23. The semiconductor device package of claim 20, wherein at least two adjacent leads extending from the enclosure are shielded leads.

24. The semiconductor device package of claim 20, wherein a first end of the conductive base of the shielded lead is disposed within the enclosure, and wherein the non-conductive layer extends through a side of the enclosure to a location adjacent to the first end.

25. The semiconductor device package of claim 24, wherein the conductive layer extends through the side of the enclosure.

26. The electrical circuit assembly comprising:
a circuit board configured to support circuitry and to be electrically connected to the circuitry when assembled therewith; and
a semiconductor device mounted on and electrically coupled to the circuit board, the semiconductor device including a semiconductor circuit disposed on a circuit support, an enclosure at least partially surrounding the support, and a plurality of leads electrically coupled to the circuit and extending from the enclosure, at least one of the leads comprising a shielded lead, the shielded lead having a conductive base, a non-conductive layer disposed on and extending at least a portion of the base, and a conductive layer disposed on and extending along a portion of the non-conductive layer.

27. The electrical circuit assembly of claim 26, wherein the conductive base of the shielded lead has a first length, and a non-conductive layer has a second length less than the first length, whereby the conductive base extends beyond the non-conductive layer adjacent to at least one end thereof.

28. The electrical circuit assembly of claim 27, wherein the shielded lead is electrically coupled to the circuit board at the end of the shielded lead at which the conductive base extends beyond a non-conductive layer.

29. The electrical circuit assembly of claim 26, wherein the semiconductor device is secured to the circuit board via the plurality of leads.

30. The electrical circuit assembly of claim 26, wherein the plurality of leads are disposed in a matrix extending from the enclosure.

* * * * *